United States Patent [19]

Cricchi et al.

[11] 3,898,603

[45] Aug. 5, 1975

[54] INTEGRATED CIRCUIT WAFERS CONTAINING LINKS THAT ARE ELECTRICALLY PROGRAMMABLE WITHOUT JOULE-HEATING MELTING, AND METHODS OF MAKING AND PROGRAMMING THE SAME

[75] Inventors: James R. Cricchi; Walter J. Lytle, both of Catonsville; David S. Herman, Columbia, all of Md.

[73] Assignee: Westinghouse Electric Corporation, Pittsburgh, Pa.

[22] Filed: July 30, 1969

[21] Appl. No.: 846,165

[52] U.S. Cl. .................... 337/297; 174/68.5; 337/1

[51] Int. Cl. .................... H01h 85/04

[58] Field of Search ....... 174/68.5; 337/1, 290, 293, 337/296, 297

[56] References Cited

UNITED STATES PATENTS

| | | | |
|---|---|---|---|
| 3,028,659 | 4/1962 | Chow et al. | 174/68.5 X |
| 3,042,741 | 7/1962 | Cumpston, Jr. | 174/68.5 |
| 3,213,325 | 10/1965 | Lindstrand | 174/68.5 X |

FOREIGN PATENTS OR APPLICATIONS

| | | | |
|---|---|---|---|
| 867,090 | 5/1961 | United Kingdom | 337/297 |

*Primary Examiner*—J. D. Miller
*Assistant Examiner*—Fred E. Bell
*Attorney, Agent, or Firm*—D. Schron

[57] ABSTRACT

Integrated circuit wafers are provided with links of such nature as to render the wafers electrically programmable without reliance upon joule-heating melting to destroy the links in the desired locations. The joule-heating melting previously used with electrically programmable wafers causes undesired effects such as volatilization, unwanted diffusions, etc. With use of photoengraving and etching techniques, there can be produced upon a wafer, according to this invention, links of novel kind that respond, through a defect-aided electromigration effect, to current densities below those required with the hitherto-known links fusible by joule heating. The novel links are of metal, typically about 0.4 mil wide and 50–1500 Angstroms thick, being used to join permanent connection members on the integrated circuit wafer, with the permanent connection members being on the order of 5000 Angstroms thick.

2 Claims, 4 Drawing Figures

INTEGRATED CIRCUIT WAFERS CONTAINING LINKS THAT ARE ELECTRICALLY PROGRAMMABLE WITHOUT JOULE-HEATING MELTING, AND METHODS OF MAKING AND PROGRAMMING THE SAME

BACKGROUND OF THE INVENTION

1. Field of the Invention:

This invention relates to articles of manufacture that comprise integrated circuit wafers and similar articles that comprise, on at least one surface thereof, an array of permanent connection members that, at suitable locations, are joined by link members that are, like fuses, intended to be capable of being destroyed so as to yield an object that will later operate or react in a suitable manner, in accordance with its circuitry and the choice that has been made of the one or ones of the above-mentioned links to be destroyed. Such objects comprise read-only information storage means. In other aspects, the invention relates to methods of providing links of a novel kind, and to a method of programming a circuit that contains a plurality of the links of the novel kind.

2. Description of the Prior Art:

It is known how integrated circuits can be produced, using wafers of silicon within which, in certain areas thereof, active elements such as transistors or the like are produced by known diffusion techniques, with it also being known that it is common to cause the wafer of silicon metal to have a layer of silicon dioxide grown on it. Appropriate windows are opened in the silicon dioxide layers in the vicinity of the particular active elements, and by the use of photoengraving or etching techniques, or otherwise, permanent connection members are deposited on or otherwise affixed to the layer of silicon dioxide in an appropriate pattern, considering the intended purpose of the circuit of the integrated circuit wafer. The permanent connection members may be, as is known, conductors of aluminum or other suitable metal, having dimensions such as 0.6 mil wide by 5000 Angstroms thick. It is known, moreover, to provide integrated circuit wafers of the kind indicated above that have, at strategic locations in their array of permanent conductor members suitable link members that can be operated, like ordinary electrical fuses, so as to melt by the action of joule heating when a current of sufficient amperage is passed through them. With such an integrated circuit wafer, the idea is that it should be possible to make a large number of identical wafers and then, by applying the electrical current of sufficient amperage to certain selected ones of the above-mentioned fusible links, electrically "program" the circuit of the wafer, causing certain desired ones of the active elements of the integrated circuit to become operative while others of the active elements of the integrated circuit are rendered inoperative.

A considerable drawback associated with the use of melting by joule heating as a way of causing certain ones of the fusible links to be opened is that the programming of an integrated circuit wafer in this way leads to other difficulties, such as penetration of the silicon-dioxide layer by the molten aluminum or other metal forming the fuse, an unwanted volatilization and redeposition of the fused metal. For that reason, electrical programming of integrated circuit wafers and other articles of this type has not been widely practiced. Instead, it has been more common to cause an integrated circuit wafer to be programmed physically, that is, by providing a permanent-connection array that activates and leaves unactivated desired ones of the active elements of the wafer. Naturally, this makes it quite inconvenient to program an integrated circuit wafer, since link members are not used and each one is essentially custom-made.

It is known, from work in recent years in the field of physics, that when electrical direct current is applied to a defect-containing member of metal, there is a defect-aided electromigration phenomenon that, when the cross section of metal being dealt with is sufficiently small and the current density to which it is subjected to is sufficiently high, will cause rupture of the metal member involved in the vicinity of the defect. Reference is made to the article of R. V. Penney titled "Current Induced Mass Transport in Alumina" in the Journal of the Physics and Chemistry of Solids, Vol. 25, pages 335–345, 1964, and the article of H. B. Huntington and A. R. Grove, in the Journal of the Physics and Chemistry of Solids, Vol. 20, page 76, 1961. A rupture of this kind will take place under conditions of current density and temperature substantially lower than those required for melting by joule heating, but it appears that the prior art has not suggested the use of this phenomenon for the electrical programming of integrated circuit wafers or other articles of manufacture in the area of read-only information storage, nor has the prior art given any indication of how to make or use circuit links that are susceptible of programming by means of the phenomenon of defect-aided electromigration.

As an aid in understanding the procedure adopted for the production of links in accordance with the invention, it should be considered that it is also known that it is possible to produce thin layers of metal upon a surface by a combination of vapor deposition with photoengraving and etching techniques. To be more precise, the members that are to be produced upon an integrated circuit wafer or the like in accordance with the invention, serving as permanent connection members or as links, have dimensions such as 0.1–1 mil wide by 50–10,000 Angstroms thick, with the length being whatever is required in the circumstances. It was known, before this invention was made, how to produce, using photoengraving and etching techniques, a permanent connection member of, for example, aluminum metal, having dimensions of 5000 Angstroms thick, 0.6 mil wide, and length as required. The known technique involves coating the entire surface where the member is to be placed with aluminum to a thickness of 5000 Angstroms, applying to the aluminum-coated surface a photoresist material such as a gel or emulsion of silver bromide, applying light energy to all the portions of the surface where the permanent connection member is to be laid down, washing away in developer or the like the unpolymerized photoresist material, immersing the wafer in a suitable acid to cause the exposed portions to be etched away while the developed photoresist material protects the aluminum under it, and then finally removing the developed photoresist material by immersing the wafer in a suitable solvent, such as trichlorethylene.

Another feature of prior art that should be understood in order to appreciate our invention properly is that it is known how to produce a suitable coating of silicon dioxide on a silicon semiconductor wafer of the kind used for integrated circuits. Various ways are known. According to one that is commonly used, the loci of the active elements are suitably masked and etched using photoengraving techniques, leaving the surface of the silicon wafer exposed, and the silicon wafer is then warmed in an oxygen-containing atmosphere to cause growth of a silicon dioxide layer in the exposed areas. If this is impracticable or undesirable, it is also known how a silicon dioxide layer can be produced on a wafer by the use of low-temperature cathode sputtering or by the reaction, at about 400°C, of silane ($SiH_4$) with oxygen.

SUMMARY OF THE INVENTION

Articles are made that are electrically programmable without the use of joule-heating melting, thereby avoiding unwanted diffusions and unwanted volatilizations and redepositions. Links are made, e.g., of metal of about 50–1500 Angstroms thick, by the use of vapor deposition combined with photoengraving and etching techniques. A wafer or the like that has on a surface thereof a plurality of permanent connection members, on the order of 5000–15,000 Angstroms thick, joined by links of the kind mentioned above, can conveniently be electrically programmed by applying an electrical potential difference across the desired ones of the links, with the potential difference being of such magnitude as to generate a current density sufficient to rupture the desired ones of the links by the operation of the defect-aided electromigration phenomenon, but insufficient to cause joule-heating melting. The use of current densities high enough to have a substantial joule-heating effect, without causing melting, is desirable, since this diminishes the time to rupture. Once that an article has been made and programmed in accordance with the practices indicated above, it may naturally be used in various ways known to those skilled in the arts of computer operation or logic-circuit design.

DESCRIPTION OF THE DRAWINGS

A complete understanding of the invention may be had from the foregoing and following description thereof, taken together with the appended drawings, in which.

Attention is also directed to the four Wrotnowski diagrams presented hereinbelow, covering four different practices for making links in accordance with present invention.

DESCRIPTION OF THE PREFERRED EMBODIMENTS

Figure 1:
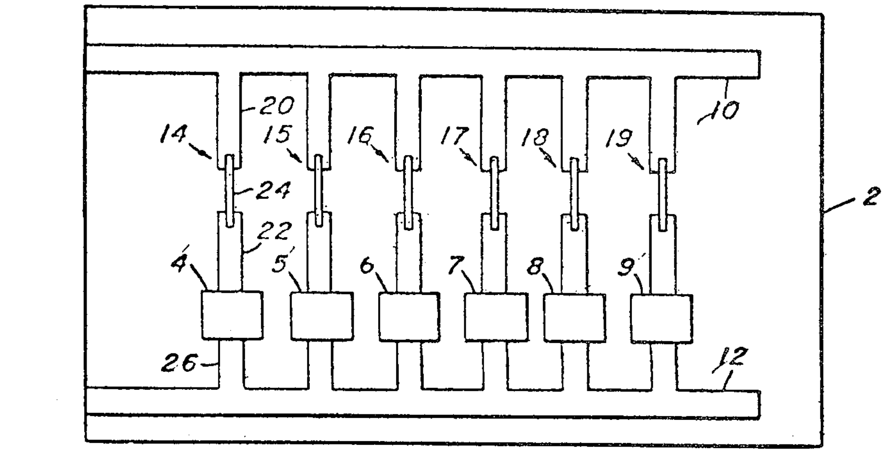
FIG. 1 is a schematic plan view of the upper surface of an integrated circuit wafer that is provided with links in accordance with the present invention.

Referring now to FIG. 1, there is shown an integrated circuit wafer 2, within which there has been produced, in accordance with known techniques, a plurality of active elements 4–9, inclusive. The active elements 4–9 may be in the nature of transistors, condensers, diodes, etc. FIG. 1 also shows a first permanent connection member 10, a second permanent connection member 12, and a plurality of branches 14–19, inclusive, extending between the members 10 and 12.

The branch 14 will be described in detail. Description of the other branches 15–19, inclusive, may be omitted in the interest of brevity, since in each case the structure is substantially the same, except that there is no requirement that the active element be of the same value or kind as the active element 4 in the branch 14. The branch 14 comprises a first permanent connection portion 20, a second permanent connection portion 22, a link 24 extending between the permanent connection portions 20 and 22, and a permanent connection portion 26 extending between the active element 4 and the member 12. It is to be understood that the permanent connection members or portions thereof mentioned above are of metal, having dimensions on the general order of 0.1–1 mil wide by 5000–15,000 Angstroms thick, with the length being as necessary. Although the metal used for the permanent connection members may conveniently be aluminum (which, for a metal, has a relatively high vapor pressure, facilitating its vapor deposition), it is also possible to use other metals of at least moderately good electrical conductivity. For the link 24, which is destructible by the application to the portions 20 and 22 of contacts providing a suitable electrical potential difference, as hereinafter more fully taught, it is possible to use the same metal or a different metal. The link 24 will have dimensions on the order of 0.1–1 mil wide by 50–1500 Angstroms thick by length as needed. Satisfactory results have been obtained by using aluminum metal for both the permanent connection member 10 and the fusible link 24, with the permanent connection members being 0.8 mil wide by 5000 Angstroms thick and with the link 24 being 0.4 mil wide by 500 Angstroms thick.

The structure described above may be programmed by the generation in a desired one or in desired ones of the branches 14–19, inclusive, of currents that are sufficiently high to yield in the vicinity of the links in the desired ones of the branches a rupture of the link by the action of the phenomenon of defect-aided electromigration. It is intended, moreover, that the current used be such that melting of the link 24 by joule heating does not occur. It is desirable, moreover, not to use merely the minimum current density that will produce a rupture by defect-aided electro-migration. The time required to produce a rupture can be diminished if there is used a current density somewhat greater, so that the passage through the link 24 will generate therein a substantial joule-heating effect, but for reasons indicated above, it is desirable that this joule-heating effect not be so great as to cause melting of the link by the operation of the joule-heating effect alone. Moreover, although theoretical equations are available for calculating the force that is exerted on a defect as a result of the use of certain conditions of metal density, self-diffusion coefficient of the metal used, absolute temperature of the fuse, and ion charge, there is from such an equation no practical guidance as to the magnitude of the current density to be used, since the number and size of defects in the link 24 and/or its junctions with the portions 20, 22 must be determined by empirical means and control of these defects is subject to the surface and metal-deposition conditions encountered or utilized. In connection with FIGS. 2 and 3 hereof, however, one level of current density operative to produce results in accordance with the invention will be taught, and it is held that in the light of this teaching those skilled in the art will be able readily, after a minimum of experimentation, to select and use levels of current density that are consonant with the requirements stated hereinabove.

Figure 3:
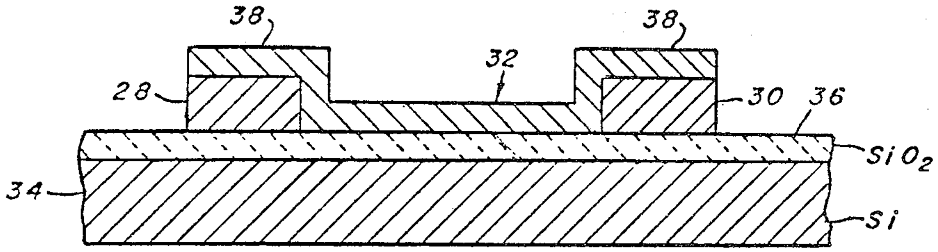
FIG. 3 is a view taken on the line III—III of FIG. 2.
Figure 2:
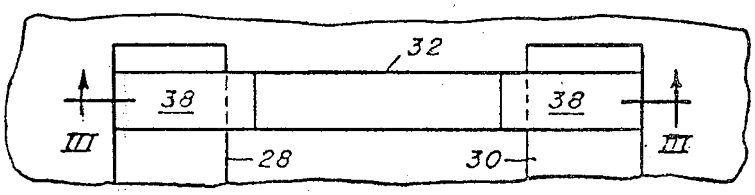
FIG. 2 is a schematic plan view of a portion of an integrated circuit wafer that contains a link in accordance with the present invention.

Referring now to FIG. 2, there is shown a pair of permanent-connection members 28, 30, connected by a link 32. As can be seen in FIG. 3, the shown portion of the integrated-circuit wafer comprises a substrate 34 of silicon semiconductor, having thereon a stratum of silicon dioxide 36, upon which the above-mentioned permanent-connection members 28 and 30 and link 32 are positioned. As will also be seen from FIG. 3, the link 32 is stepped, having raised end portions 38 that overlie the members 28 and 30.

As an example of specific materials and dimensions that can be used, it may be considered that the connections 28 and 30 are each of aluminum metal, being 1500 Angstroms thick by 0.7 mil wide and as long as necessary. The link 32 is 0.4 mil wide, 500 Angstroms thick, and about 0.4 mil long. The link 32 has a typical cross section area of $5 \times 10^{-9}$ cm$^2$, so that at a current passing therethrough of 5 milliamperes, there is obtained a current density of one million amperes per square centimeter, which is sufficient to cause rupture by defect-aided electromigration and provide joule heating to some extent, but not enough to cause melting of the aluminum in the link 32.

The technique for making a stepped link, such as the link 32, is adequately disclosed in the following flow diagram.

PREPARE SILICON WAFER FOR INTEGRATED CIRCUIT, INCLUDING FORMING ACTIVE ELEMENTS IN IT BY DIFFUSION TECHNIQUES

COVER WAFER SUITABLY WITH SILICON DIOXIDE

VAPOR-DEPOSIT ALUMINUM ALL OVER UPPER SURFACE OF WAFER 5000 ANGSTROMS THICK

APPLY PHOTORESIST MATERIAL OVER ENTIRE UPPER SURFACE OF WAFER

APPLY LIGHT ENERGY TO PHOTORESIST IN SUCH PATTERN THAT PLACES WHERE PERMANENT CONNECTIONS ARE TO BE FORMED ARE POLYMERIZED AND OTHERS ARE NOT

WASH UNEXPOSED PHOTORESIST AWAY BY IMMERSING IN SOLVENT SUCH AS XYLENE

IMMERSE WAFER IN ACID TO ETCH AWAY ALUMINUM IN AREAS OTHER THAN LOCI OF PERMANENT CONNECTIONS

REMOVE DEVELOPED PHOTORESIST OVER THE ALUMINUM PERMANENT CONNECTIONS

AGAIN COVER ENTIRE UPPER SURFACE OF WAFER WITH PHOTORESIST

APPLY LIGHT ENERGY TO ALL BUT THE LOCI OF LINKS AND THEIR JUNCTIONS WITH PERMANENT CONNECTIONS

WASH UNDEVELOPED PHOTORESIST AWAY TO

REVEAL LINK LOCI

VACUUM-DEPOSIT ON UPPER SURFACE OF WAFER A LAYER OF ALUMINUM 500 ANGSTROMS THICK

WASH WAFER IN SUITABLE SOLVENT SUCH AS TRICHLOROETHYLENE TO REMOVE DEVELOPED PHOTORESIST AND OVERLYING STRATA WHERE NOT HELD BY METAL-METAL BOND

APPLY IN DESIRED PATTERN A CURRENT OF HIGH DENSITY BUT LESS THAN ENOUGH TO CAUSE MELTING BY JOULE HEATING, THEREBY PROGRAMMING THE WAFER ELECTRICALLY WITHOUT CONCOMITANT DRAWBACKS

USE THE PROGRAMMED WAFER

Figure 4:
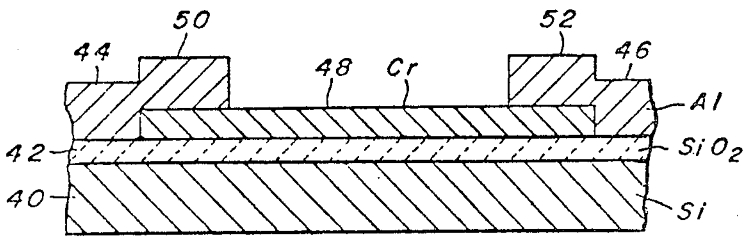
FIG. 4 is a cross-sectional view that corresponds to FIG. 3, illustrating an alternative embodiment of structure of a link in accordance with the invention.

Referring now to FIG. 4, there is shown a view in which there is seen a portion of a cross section of an integrated-circuit breaker comprising a silicon metal substrate 40 with an overlying stratum of silicon dioxide 42, with the permanent connections being indicated at 44 and 46 and the link being indicated at 48. In this embodiment of the invention, the link 48 is of chromium metal, and the permanent-connection members have portions 40 and 52 that overlie the link 48.

One procedure for making a link such as that shown in FIG. 4 is disclosed in the following flow diagram.

PREPARE SILICON WAFER FOR INTEGRATED CIRCUIT, INCLUDING FORMING ACTIVE ELEMENTS IN IT BY DIFFUSION TECHNIQUES

COVER WAFER SUITABLY WITH SILICON DIOXIDE

PROVIDE OVERALL ON THE UPPER SURFACE OF THE WAFER A SUITABLE DEPOSIT OF CHROMIUM ABOUT 500 -ANGSTROMS THICK.

ETCH THE EXCESS CHROMIUM AWAY TO PROVIDE AN APPROPRIATE PATTERN OF LINKS

DEPOSIT ALUMINUM OVERALL TO THICKNESS OF 5000 ANGSTROMS

COVER WAFER WITH PHOTORESIST

APPLY LIGHT ENERGY TO PHOTORESIST IN SUCH PATTERN THAT THERE ARE POLYMERIZED THE PORTIONS WHERE THE ALUMINUM IS TO REMAIN AS PERMANENT CONNECTIONS

WASH UNEXPOSED PHOTORESIST AWAY BY IMMERSING IN SOLVENT SUCH AS XYLENE, LEAVING DEVELOPED PHOTORESIST OVER THE LOCI OF THE PERMANENT CONNECTIONS

ETCH THE WAFER IN ACID THAT ATTACKS ALUMINUM BUT NOT CHROMIUM

REMOVE THE OVERLYING DEVELOPED PHOTORESIST

APPLY IN DESIRED PATTERN A CURRENT OF HIGH DENSITY BUT LESS THAN ENOUGH TO CAUSE MELTING BY JOULE HEATING, THEREBY PROGRAMMING THE WAFER ELECTRICALLY WITHOUT CONCOMITANT DRAWBACKS

USE THE PROGRAMMED WAFER

The drawbacks of the procedure mentioned above is that it is sometimes difficult to get the desired good bond between the chromium and the aluminum, owing to the tendency of the chromium to develop an oxide layer on its surface as soon as the vacuum is broken. A modified procedure that tends to overcome this difficulty is disclosed in the following flow diagram.

PREPARE SILICON WAFER FOR INTEGRATED CIRCUIT, INCLUDING FORMING ACTIVE ELEMENTS IN IT BY DIFFUSION TECHNIQUES

COVER WAFER SUITABLY WITH SILICON DIOXIDE

VAPOR-DEPOSIT ON THE WAFER 500 ANGSTROMS OF CHROMIUM

WITHOUT BREAKING VACUUM, VAPOR-DEPOSIT ON WAFER ABOUT 500 to 1000 ANGSTROMS OF ALUMINUM

ETCH THE ALUMINUM AWAY FROM THE WAFER EXCEPT IN THE LOCI OF JUNCTION BETWEEN THE CHROMIUM FOR THE LINKS AND THE ALUMINUM LATER TO BE LAID DOWN FOR THE PERMANENT CONNECTIONS, MAKING LINK END PADS OF ALUMINUM

COVER WAFER WITH PHOTORESIST

APPLY LIGHT ENERGY TO WAFER IN SUCH PATTERN THAT THERE ARE DEVELOPED THE PORTIONS OTHER THAN WHERE THE LINKS ARE TO BE

WASH UNEXPOSED PHOTORESIST AWAY BY IMMERSING IN SOLVENT SUCH AS XYLENE, LEAVING DEVELOPED PHOTORESIST OVER THE LOCI OF THE LINKS AND THE END PADS ASSOCIATED THEREWITH

IMMERSE WAFER IN ETCHANT FOR ALUMINUM, RINSE WITH WATER, AND IMMERSE IN ETCHANT FOR CHROMIUM, NEITHER ETCHANT BEING ONE THAT AFFECTS SILICON

REMOVE DEVELOPED PHOTORESIST BY IMMERSING IN SUITABLE SOLVENT SUCH AS TRICHLOROETHYLENE

VAPOR-DEPOSIT ALUMINUM ON WAFER 5000 ANGSTROMS THICK

APPLY PHOTORESIST

APPLY LIGHT ENERGY TO PHOTORESIST IN SUCH PATTERN THAT THERE ARE DEVELOPED THE PORTIONS ONLY IN THE LOCI OF THE PERMANENT CONNECTIONS

WASH AWAY UNEXPOSED PHOTORESIST, EXPOSING ALL BUT THE LOCI OF THE PERMANENT CONNECTIONS

IMMERSE WAFER IN ETCHANT THAT ATTACKS ALUMINUM BUT NOT CHROMIUM, THEREBY REMOVING ALL THE ALUMINUM EXCEPT THAT REQUIRED FOR THE PERMANENT CONNECTIONS

APPLY IN A DESIRED PATTERN A CURRENT OF HIGH DENSITY BUT LESS THAN ENOUGH TO CAUSE MELTING BY JOULE HEATING, THEREBY PROGRAMMING THE WAFER ELECTRICALLY WITHOUT CONCOMITANT DRAWBACKS

USE THE PROGRAMMED WAFER

It will be seen that in the procedure described above, the chromium and the aluminum are deposited without permitting any break in the vacuum, so that the thus-indicated difficulty of inadvertent oxidation of the chromium is completely overcome.

There is yet another mode of practicing the invention, in accordance with which there is produced an integrated-circuit having permanent connections and links between the permanent connections, with the links being covered with a layer of silicon dioxide. This is advantageous, in that it prevents volatilization of the metal comprising the links from occurring if it should happen that there has been inadvertently been used a current density high enough to cause melting by joule heating. This practice is shown in the following flow diagram.

PREPARE SILICON WAFER FOR INTEGRATED CIRCUIT, INCLUDING FORMING ACTIVE ELEMENTS IN IT BY DIFFUSION TECHNIQUES

COVER WAFER SUITABLY WITH SILICON DIOXIDE

VAPOR-DEPOSIT ALUMINUM OVER UPPER SURFACE OF WAFER TO THICKNESS OF 500 ANGSTROMS

APPLY PHOTORESIST

APPLY LIGHT ENERGY TO PHOTORESIST TO DEVELOP THE REGIONS OTHER THAN THE INTENDED LOCI OF THE LINKS

WASH AWAY UNEXPOSED PHOTORESIST WITH XYLENE

ETCH WITH ACID TO REMOVE UNWANTED ALUMINUM

COVER ENTIRE UPPER SURFACE WITH SILICON DIOXIDE, USING SUITABLE TECHNIQUE SUCH AS LOW-TEMPERATURE SPUTTERING OR THE OXIDATION OF SILANE

OPEN WINDOWS IN THE SILICON DIOXIDE LAYER SO DEPOSITED IN THE INTENDED LOCI OF PERMANENT CONNECTIONS

VAPOR-DEPOSIT ALUMINUM OF THE UPPER SURFACE OF THE WAFER TO A THICKNESS OF 5000 ANGSTROMS

APPLY PHOTORESIST

APPLY LIGHT ENERGY TO THE PHOTORESIST TO CAUSE DEVELOPMENT OF THE LOCATIONS OF THE PERMANENT CONNECTIONS

REMOVE UNDEVELOPED PHOTORESIST

IMMERSE WAFER IN ETCHANT THAT ATTACKS ALUMINUM TO REMOVE THE DEPOSITED ALUMINUM EXCEPT IN THE LOCI OF THE PERMANENT CONNECTIONS

APPLY IN A DESIRED PATTERN AN CURRENT OF HIGH DENSITY BUT LESS THAN ENOUGH TO CAUSE MELTING BY JOULE HEATING, THEREBY PROGRAMMING THE WAFER ELECTRICALLY WITHOUT CONCOMITANT DRAWBACKS

USE THE PROGRAMMED WAFER

Although the invention has been hereinabove described with particular reference to the production and programming of relatively low-current devices, i.e., printed circuits on wafers of silicon or the like, those skilled in the art will understand and appreciate that in its broader aspects the invention pertains as well to the production and programming of devices wherein the current levels used may be substantially greater, such as in circuit breakers or the like. To be somewhat more specific, the invention thus relates in its broadest aspect to the creation of link members substantially smaller in cross section than the permanent-connection members which they join, with the link members being of such dimensions as to be capable of being ruptured by the application of an electrical current of such magnitude as to cause rupture by the phenomenon of defect-aided electromigration and substantially without joule heating. Such devices, in common with the particular kinds of printed-circuit devices taught and described above, have the property of being programmable without unwanted volatilization and without danger of the short-circuiting or similar difficulties that may be encountered if the link were, like an ordinary fuse, of such dimensions and character as to be ruptured by mere joule heating. In its broader method aspects, the invention likewise takes in the practice of making and programming a device of the higher-current class indicated above, and again, the advantages are much the same. It is, of course, principally in the field of circuits printed on wafers of silicon or the like that the invention as it is now known is especially useful and advantageous.

The invention described herein was made in the performance of work under a NASA contract and is subject to the provisions of Section 305 of the National Aeronautics and Space Act of 1958, Public Law 85-568 (72 Stat. 435; 42 U.S.C. 2457).

We claim as our invention:

1. A method of programming a device that comprises a stratum of electrically insulating material that has thereon a pair of permanent-connection members made of electrically conducting metal and between said pair of said permanent-connection members a link member made of electrically conducting metal, said method comprising applying across selected ones of said link members an electrical potential that is sufficiently large to cause to be passed through said selected ones of said link members a current of such density as to be capable of causing rupture of said link members by the phenomenon of defect-aided electromigration but not so great as to cause melting of said link member by joule heating.

2. A method as defined in claim 1, characterized in that said permanent-connection members are in the form of strips having a thickness of about 5,00 to 15,000 Angstroms and in that said link member is in the form of a strip having a thickness of about 50 to 1,500 Angstroms.

* * * * *